(12) United States Patent
Lee et al.

(10) Patent No.: US 11,600,577 B2
(45) Date of Patent: Mar. 7, 2023

(54) SEMICONDUCTOR DEVICES

(71) Applicant: Taiwan Semiconductor Manufacturing Company, Ltd., Hsinchu (TW)

(72) Inventors: Pei-Wei Lee, Pingtung County (TW); Pang-Yen Tsai, Hsin-Chu (TW); Tsung-Yu Hung, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 63 days.

(21) Appl. No.: 17/069,805

(22) Filed: Oct. 13, 2020

(65) Prior Publication Data

US 2021/0043454 A1  Feb. 11, 2021

Related U.S. Application Data

(63) Continuation of application No. 16/286,542, filed on Feb. 26, 2019, now Pat. No. 10,811,255.

(Continued)

(51) Int. Cl.
*H01L 23/00* (2006.01)
*H01L 21/033* (2006.01)
*H01L 21/762* (2006.01)
*H01L 21/02* (2006.01)
*H01L 29/04* (2006.01)
(Continued)

(52) U.S. Cl.
CPC ...... *H01L 23/562* (2013.01); *H01L 21/02104* (2013.01); *H01L 21/02532* (2013.01); *H01L 21/02667* (2013.01); *H01L 21/02669* (2013.01); *H01L 21/02672* (2013.01); *H01L 21/0332* (2013.01); *H01L 21/0337* (2013.01); *H01L 21/67288* (2013.01); *H01L 21/76224* (2013.01); *H01L 21/76262* (2013.01); *H01L 21/76278* (2013.01); *H01L 21/76281* (2013.01); *H01L 21/76283* (2013.01); *H01L 22/12* (2013.01); *H01L 23/564* (2013.01); *H01L 23/58* (2013.01); *H01L 29/04* (2013.01); *H01L 29/045* (2013.01); *H01L 29/66651* (2013.01)

(58) Field of Classification Search
CPC ..... H01L 23/562; H01L 23/564; H01L 23/58; H01L 2924/3512; H01L 21/02532; H01L 21/02667; H01L 21/0332; H01L 21/0337; H01L 21/67288; H01L 21/76224; H01L 22/12; H01L 29/04; H01L 29/045
See application file for complete search history.

(56) References Cited

U.S. PATENT DOCUMENTS 6,492,220 B2 * 12/2002 Ikeda ............... H01L 21/823807
                                                                  438/433
6,611,045 B2 *  8/2003 Travis ............... H01L 21/76229
                                                                  716/54

(Continued)

*Primary Examiner* — Eduardo A Rodela
(74) *Attorney, Agent, or Firm* — JCIPRNET (57) ABSTRACT

A semiconductor device includes a substrate and a semiconductor layer. The substrate includes a planar portion and a plurality of pillars on a periphery of the planar portion. The pillars are shaped as rectangular columns, and corners of two of the pillars at the same side of the planar portion are aligned in a horizontal direction or a direction perpendicular to the horizontal direction. The semiconductor layer is disposed over the planar portion and between the pillars.

20 Claims, 7 Drawing Sheets

Related U.S. Application Data (60) Provisional application No. 62/752,370, filed on Oct. 30, 2018.

(51) Int. Cl.
  H01L 21/67 (2006.01)
  H01L 29/66 (2006.01)
  H01L 21/66 (2006.01)
  H01L 23/58 (2006.01)

(56) References Cited

U.S. PATENT DOCUMENTS

| | | | |
|---|---|---|---|
| 6,693,315 B2 * | 2/2004 | Kuroda | H01L 23/5283 |
| | | | 257/E21.244 |
| 6,972,478 B1 * | 12/2005 | Waite | H01L 27/1207 |
| | | | 257/E21.633 |
| 7,554,139 B2 * | 6/2009 | Inoue | H01L 27/088 |
| | | | 257/E27.06 |
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,673,330 B2 * | 6/2017 | Chung | H01L 29/1033 |
| 2011/0140245 A1 * | 6/2011 | Lane | H01L 29/0657 |
| | | | 257/E23.194 |
| 2014/0339703 A1 * | 11/2014 | Farooq | H01L 23/53214 |
| | | | 257/762 |
| 2015/0325531 A1 * | 11/2015 | Dyer | H01L 23/50 |
| | | | 257/620 |
| 2018/0130900 A1 * | 5/2018 | Usami | H01L 21/823871 |

\* cited by examiner

SEMICONDUCTOR DEVICES

CROSS-REFERENCE TO RELATED APPLICATION

This application is a continuation application of and claims the priority benefit of a prior application Ser. No. 16/286,542, filed on Feb. 26, 2019, and claims the priority benefit of U.S. provisional application Ser. No. 62/752,370, filed on Oct. 30, 2018. The entirety of each of the above-mentioned patent applications is hereby incorporated by reference herein and made a part of this specification.

BACKGROUND

The increasing operating speeds and computing power of microelectronic devices have recently given rise to the need for an increase in the complexity and functionality of the semiconductor structures from which that these devices are fabricated. Hetero-integration of dissimilar semiconductor materials, for example, III-V materials, such as gallium arsenide, gallium nitride, indium aluminum arsenide, and/or germanium with silicon or silicon-germanium, is an attractive path to increasing the functionality and performance of the CMOS platform. In particular, heteroepitaxial growth can be used to fabricate many modern semiconductor devices. Performance and, ultimately, the utility of devices fabricated using a combination of dissimilar semiconductor materials, however, depends on the quality of the resulting structure. Specifically, a low level of defects is important in a wide variety of semiconductor devices and processes, because defects partition an otherwise monolithic crystal structure and introduce unwanted and abrupt changes in electrical and optical properties, which, in turn, results in poor material quality and limited performance.

As mentioned above, misfit defects typically arise in efforts to epitaxially grow one kind of crystalline material on a substrate of a different kind of material-often referred to as "heterostructure"-due to different crystalline lattice constant of the two materials. This lattice mismatch between the starting substrate and subsequent layer(s) creates strain during material deposition that generates misfit defects in the semiconductor structure.

Misfit dislocations form at the mismatched interface to relieve the misfit strain. Many misfit dislocations have vertical components, termed "threading segments," which terminate at the surface. These threading segments continue through all semiconductor layers subsequently added to the heterostructure. In addition, misfit defects can arise in the epitaxial growth of the same material as the underlying substrate where the substrate itself contains dislocations. Some of the dislocations replicate as threading dislocations in the epitaxially grown material. Other kinds of defects include stacking faults, twin boundaries, and anti-phase boundaries. Such dislocations in the active regions of semiconductor devices, such as diodes, lasers and transistors, may significantly degrade performance.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1A:
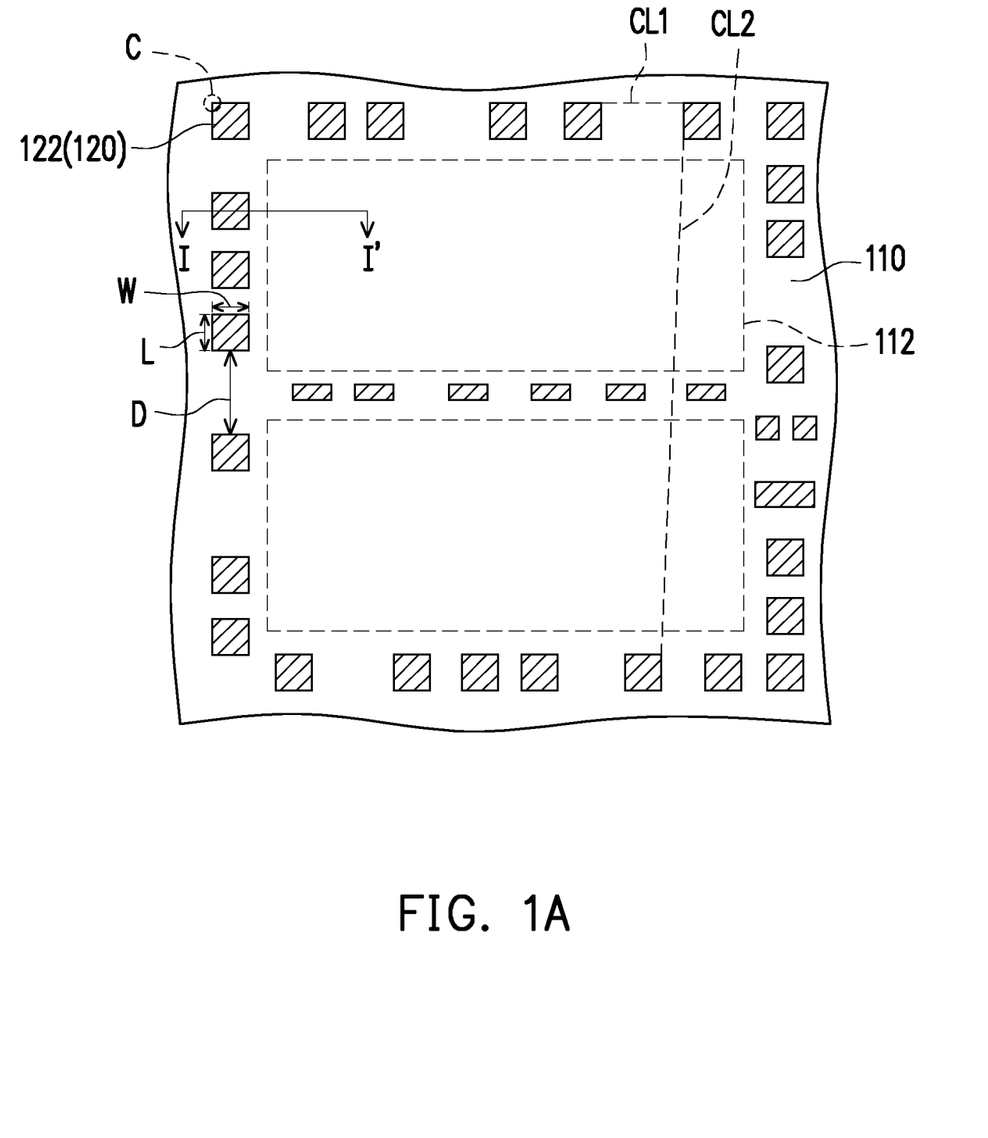
FIGS. 1A to 1D are top views at various stages of forming a semiconductor device in accordance with some embodiments of the present disclosure.

FIGS. 1A to 1D are top views at various stages of forming a semiconductor device in accordance with some embodiments of the present disclosure. FIGS. 2A to 2D are cross-sectional views along a line I-I' of FIGS. 1A to 1D at various stages of forming a semiconductor device in accordance with some embodiments of the present disclosure. Referring to FIGS. 1A and 2A, a substrate 110 is provided, and the substrate 110 includes a plurality of channel forming regions 112. In some embodiments, the substrate 100 includes, or consists essentially of, a first semiconductor material, such as, for example, a group IV element, e.g., germanium or silicon. The first semiconductor material may be crystalline. The substrate 110 may be, for example, a bulk silicon wafer, a bulk germanium wafer, a semiconductor-on-insulator (SOI) substrate, or a strained semiconductor-on-insulator (SSOI) substrate. In one embodiment, the substrate 110 includes or consists essentially of (100) silicon, for example. The substrate 110 may include a material having a first conductivity type, e.g., n- or p-type, such as $n^+$ Si.

The channel forming regions 112 are regions for forming channels, and may be also referred to as main channel regions. In some embodiments, the channel forming regions 112 are adjacent to but separated from one another, and the channel forming regions 112 may be arranged in an array, for example. In some embodiments, the channel forming regions 112 may be regions for forming channels of a second conductivity type opposite to the first conductivity type, for example. In some embodiments, portions of the substrate 110 between the channel forming regions 112 may be regions for forming channels of the first conductivity type, but the disclosure is not limited thereto. In some embodiments, the first conductivity type may be n-type, and the second conductivity type may be p-type, for example. In some alternative embodiments, the substrate 110 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED).

Then, a defect-trapping mask 120 is disposed around the channel forming regions 112 on the substrate 110. The defect-trapping mask 120 includes a plurality of hard mask patterns 122. The hard mask patterns 122 cover portions of the substrate 110 and expose portions of the substrate 110 in the channel forming regions 112 and between the hard mask patterns 122. In some embodiments, the portions of the substrate 110 covered by the defect-trapping mask 120 may be regions for forming channels of the first conductivity type, but the disclosure is not limited thereto. In some embodiments, the hard mask patterns 122 are disposed at sides of the channel forming regions 112 such as at each side of one of the channel forming regions 112. In some embodiments, the hard mask patterns 122 are disposed at opposite sides such as sides of the channel forming region 112, for example. In some embodiments, the channel forming regions 112 are immediately adjacent to one another, and thus the hard mask patterns 122 are also disposed at boundaries of the channel forming regions 112. In other words, the adjacent channel forming regions 112 share the hard mask patterns 122 therebetween. In some embodiments, the hard mask patterns 122 continuously surrounding the channel forming regions 112 are formed as a net, and thus the defect-trapping mask 120 is also referred as a defect-trapping net. In some embodiments, the defect-trapping mask 120 is directly formed on the substrate 110, that is, the defect-trapping mask 120 is in direct contact with the exposed top surface of the substrate 110, but the disclosure is not limited thereto. In some alternative embodiments, other suitable layer may be formed between the defect-trapping mask 120 and the substrate 110.

In some embodiments, in order to trap defects such as misfit defects, the hard mask pattern 122 has a plurality of corners C. In some embodiments, the hard mask pattern 122 is a prism such as a triangular prism, a rectangular prism, a pentagonal prism and a hexagonal prism. In some embodiments, a top surface the hard mask pattern 122 may be shaped as triangle, square, rectangle, pentagon, hexagon or the like, for example. The hard mask patterns 122 are separated from each other and thus are also referred as island patterns. In some embodiments, if the portion of the substrate 110 covered by the hard mask pattern 122 is then used to form the channel of the first conductivity type, a length L of the hard mask pattern 122 is not smaller than a channel length of the channel layer formed form the substrate 110, and a width W of the hard mask pattern 122 is not smaller than a channel width of the channel layer formed form the substrate 110. In some embodiments, the length L of the hard mask pattern 122 is larger than 0.05 µm, and the width W of the hard mask pattern 122 is larger than 0.05 µm, for example. In some embodiments, a height H of the hard mask pattern 122 ranges from 10 nm to 15 nm, for example. In some embodiments, at least two of the hard mask patterns 122 may have different sizes and shapes, but the disclosure is not limited thereto. In some alternative embodiments, the hard mask patterns 122 may have the same size and shape. In some embodiments, the distance D between adjacent two hard mask patterns 122 is not consistent, but the disclosure is not limited thereto. In some alternative embodiments, the distance D may be substantially the same. In some embodiments, the distance D is larger than 0.1 µm, for example. Therefore, the defect-trapping mask 120 may trap the defect efficiently. In some embodiments, the sidewall of the hard mask pattern 122 is generally vertical, i.e. disposed at about 80 to 120 degrees to the top surface of the substrate 110, and, in a particular embodiment, substantially perpendicular to the top surface of the substrate 110. In some embodiments, a material of the defect-trapping mask 120 includes a dielectric material such as silicon oxide, silicon nitride or silicon oxynitride.

When an imaginary connecting line formed between the corners C of the hard mask patterns 122 is substantially parallel to or perpendicular to a horizontal direction such as the x direction, the occurrence of the misfit defect of a material to be formed between the adjacent hard mask patterns 122 is largely increased. In some embodiments, by arranging the hard mask patterns 122, the imaginary connecting line CL1 formed outside the channel forming regions 112 is substantially parallel to or perpendicular to the horizontal direction to facilitate the formation of defect-rich material while the imaginary connecting line CL2 formed in the channel forming regions 112 is not parallel to or perpendicular to the horizontal direction to facilitate the formation of defect-free material. That is, the defects are firstly formed/trapped in portions of the material such as the material formed outside the channel forming regions 112, and other portions of the material such as the material formed in the channel forming regions 112 are prone to be defect-free.

In some embodiments, at the same side of the channel forming region 112, the imaginary connecting line CL1 formed between the corners C of the hard mask patterns 122 is substantially parallel to or perpendicular to the horizontal direction. In some embodiments, the sidewalls of the adjacent hard mask patterns 122 at the same side of the channel forming region 112 may be substantially aligned with one another in the horizontal direction or a direction perpendicular to the horizontal direction. On contrary, at opposite sides of the channel forming region 112, since the imaginary connecting line CL2 formed between the hard mask patterns 122 crosses the channel forming region 112, the imaginary connecting line CL2 is not parallel to or perpendicular to the horizontal direction. Similarly, as shown in FIG. 1A, the imaginary connecting line CL2 crossing at least two channel forming regions 112 is not parallel to or perpendicular to the horizontal direction. In other words, in order to form the defect-free material in the channel forming regions 112, the imaginary connecting line CL1 not crossing the channel forming region 112 may be substantially parallel to or perpendicular to the horizontal direction, and the imaginary connecting line CL2 crossing the channel forming region 112 should be not parallel to or perpendicular to the horizontal direction.

Figure 1B:
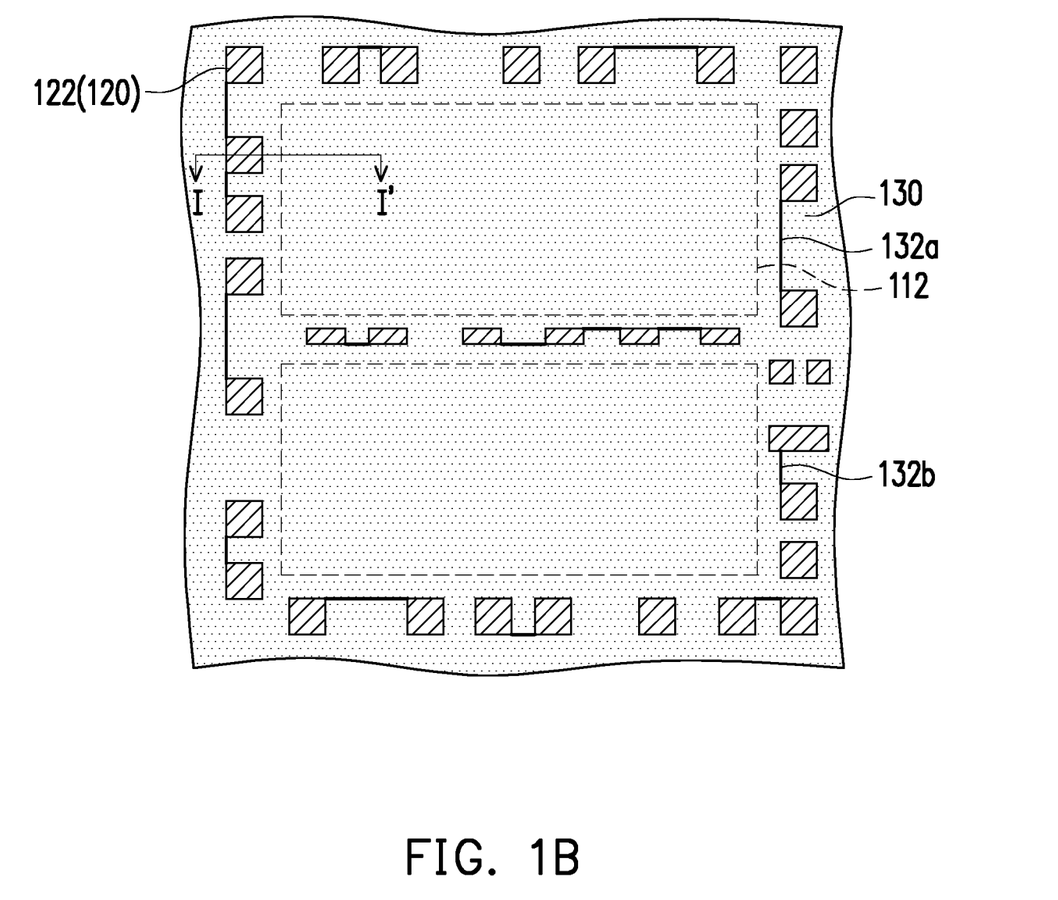
Figure 2A:
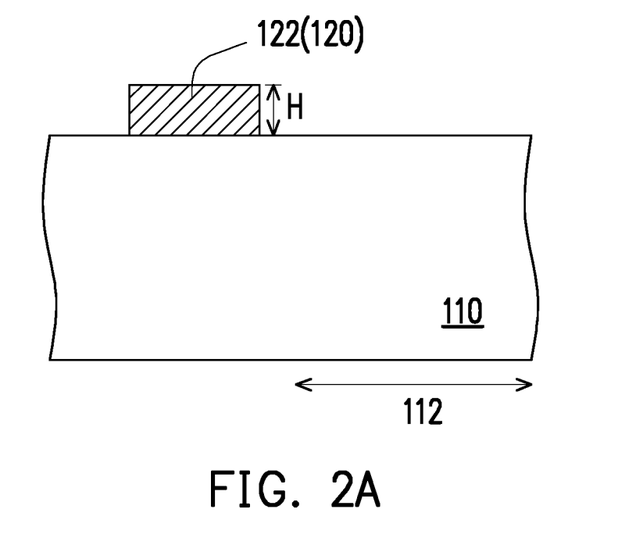
FIGS. 2A to 2D are cross-sectional views along a line I-I' of FIGS. 1A to 1D at various stages of forming a semiconductor device in accordance with some embodiments of the present disclosure.
Figure 2B:
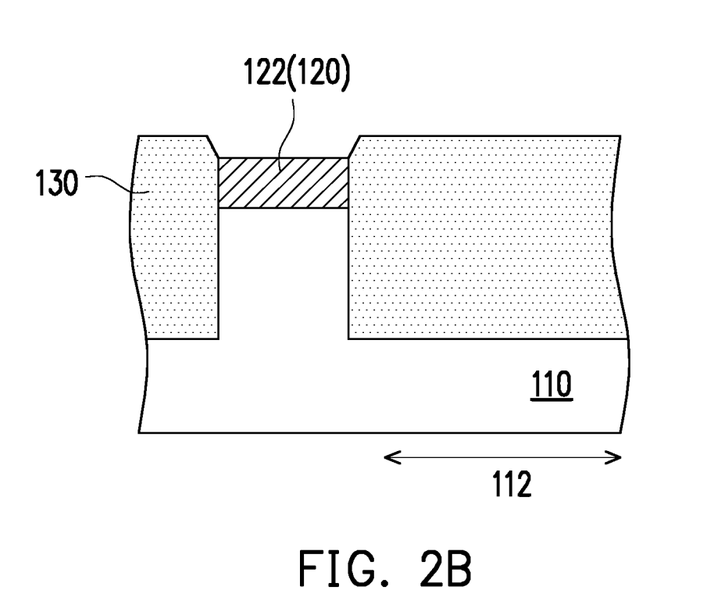

Referring to FIGS. 1B and 2B, by using the defect-trapping mask 120 as a mask, a semiconductor material 130 is formed in the channel forming regions 112 on the substrate 110. In some embodiments, before forming the semiconductor material 130, exposed portions of the substrate 110 are partially removed by using the defect-trapping mask 120 as the mask. In some embodiments, a thickness of the exposed portions of the substrate 110 is reduced, for example. In some embodiments, the substrate 110 are partially removed by an etch process such as a dry etch process or a wet etch process. After removing, a top surface of the exposed substrate 110 is lower than a top surface of the substrate 110 covered by the defect-trapping mask 120, and a height difference therebetween ranges from 55 to 75 nm, for example.

Figure 3:
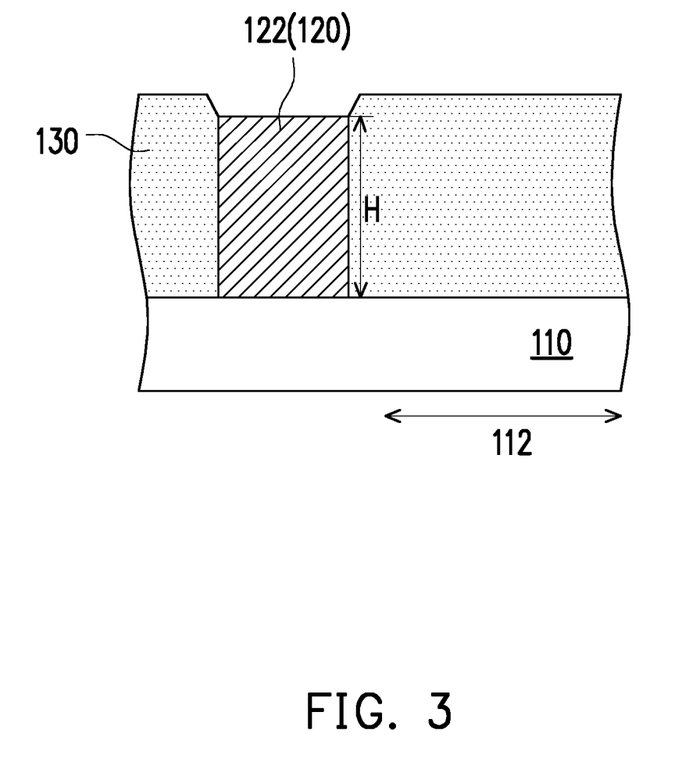
FIG. 3 is a cross-sectional view along a line I-I' of FIG. 1B in accordance with some embodiments of the present disclosure.

In some embodiments, the semiconductor material 130 is formed on the exposed substrate 110. In other words, the semiconductor material 130 is simultaneously formed in the channel forming regions 112 and the regions outside the channel forming regions 112 and between the channel forming regions 112. In some embodiments, the semiconductor material 130 is directly formed on the substrate 110, that is, the semiconductor material 130 is in direct contact with the exposed top surface of the substrate 110, but the disclosure is not limited thereto. In some alternative embodiments, other suitable layer may be formed between the semiconductor material 130 and the substrate 110. In some embodiments, the semiconductor material 130 may protrude from the defect-trapping mask 120, for example. In other words, the semiconductor material 130 is filled in a space formed between the substrate 110 and the defect-trapping mask 120, and a portion of the semiconductor material 130 is outside the space. Accordingly, a top surface of the semiconductor material 130 is higher than a top surface of the defect-trapping mask 120. However, in some alternative embodiments, the top surface of the semiconductor material 130 may be substantially the same or lower than the top surface of the defect-trapping mask 120. In some embodiments, a thickness of the semiconductor material 130 may range from 65 to 75 nm, for example. In some embodiments, the portion of the semiconductor material 130 protruding from the defect-trapping mask 120 may have a substantially flat top surface and a taper sidewall continuously connected to the top surface, but the disclosure is not limited thereto. In some alternative embodiments, the portion of the semiconductor material 130 protruding from the defect-trapping mask 120 may have a straight sidewall, for example. In some alternative embodiments, as shown in FIG. 3, the partial removal of the substrate 110 before formation of the semiconductor material 130 may be omitted, and thus the semiconductor material 130 may be formed on the substrate 110 having a substantially planar top surface. As shown in FIG. 3, in some embodiments, the semiconductor material 130 may have a thickness substantially the same as a height H of the hard mask pattern 122. In some embodiments, the height H of the hard mask pattern 122 ranges from 65 nm to 75 nm, for example.

In some embodiments, the semiconductor material 130 includes a second semiconductor material different from the first semiconductor material of the substrate 110. In some embodiments, the first semiconductor material of the substrate 110 may include, or consist essentially of, silicon or a silicon germanium alloy. The second semiconductor material of the semiconductor material 130 may include, or consist essentially of, a group II, a group III, a group IV, a group V, and/or a group VI element, and/or combinations thereof, for example, selected from the group consisting of germanium, silicon germanium, gallium arsenide, aluminum antimonide, indium aluminum antimonide, indium antimonide, indium arsenide, indium phosphide, and gallium nitride. In some embodiments, the semiconductor material 130 may include a material having the second conductivity type, e.g., n- or p-type, which is opposite to the first conductivity type.

In some embodiments, the semiconductor material 130 includes silicon germanium, which is expressed as $Si_{(1-x)}Ge_x$, wherein value X is the atomic percentage of germanium in the semiconductor material 130, which atomic percentage may be between about 0 (0 percent) and 1 (100 percent) in exemplary embodiments. The semiconductor material 130 may also include pure germanium (when x is equal to 1) or substantially pure germanium (when x is greater than about 0.9, for example). The semiconductor material 130 may also include pure silicon (when x is equal to 0) or substantially pure silicon (when x is smaller than about 0.1, for example).

In some embodiments, the semiconductor material 130 may be formed by selective epitaxial growth process in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), or by atomic layer deposition (ALD). In the CVD process, selective epitaxial growth process typically includes introducing a source gas into the chamber. The source gas may include at least one precursor gas and a carrier gas, such as, for example hydrogen. The reactor chamber is heated, such as, for example, by RF-heating. The growth temperature in the chamber ranges from about 300° C. to about 900° C. depending on the composition of the semiconductor material 130. The growth system also may utilize low-energy plasma to enhance the layer growth kinetics.

In some embodiments, as shown in FIG. 1B, the corners C of the hard mask patterns 122 are stress-concentrated hot spots, defects 132a, 132b may be trapped at the corners C, and thus the semiconductor material 130 grown in the regions outside the channel forming regions 112 and between the channel forming regions 112 are defect-rich. As a result, the semiconductor material 130 grown in the channel forming regions 112 may be substantially defect-free. In some embodiments, the defect 132a is formed along the imaginary connecting line CL1, and the defect 132b is formed between the corner C of the hard mask pattern 122 and the sidewall of adjacent hard mask pattern 122, for example. However, it is noted that the defect 132b is rarely formed and thus may be omitted. In other words, the semiconductor material 130 in the channel forming regions 112 may be formed with a low level of dislocation defects, and thus the semiconductor material 130 in the channel forming regions 112 may have good quality.

Figure 1C:
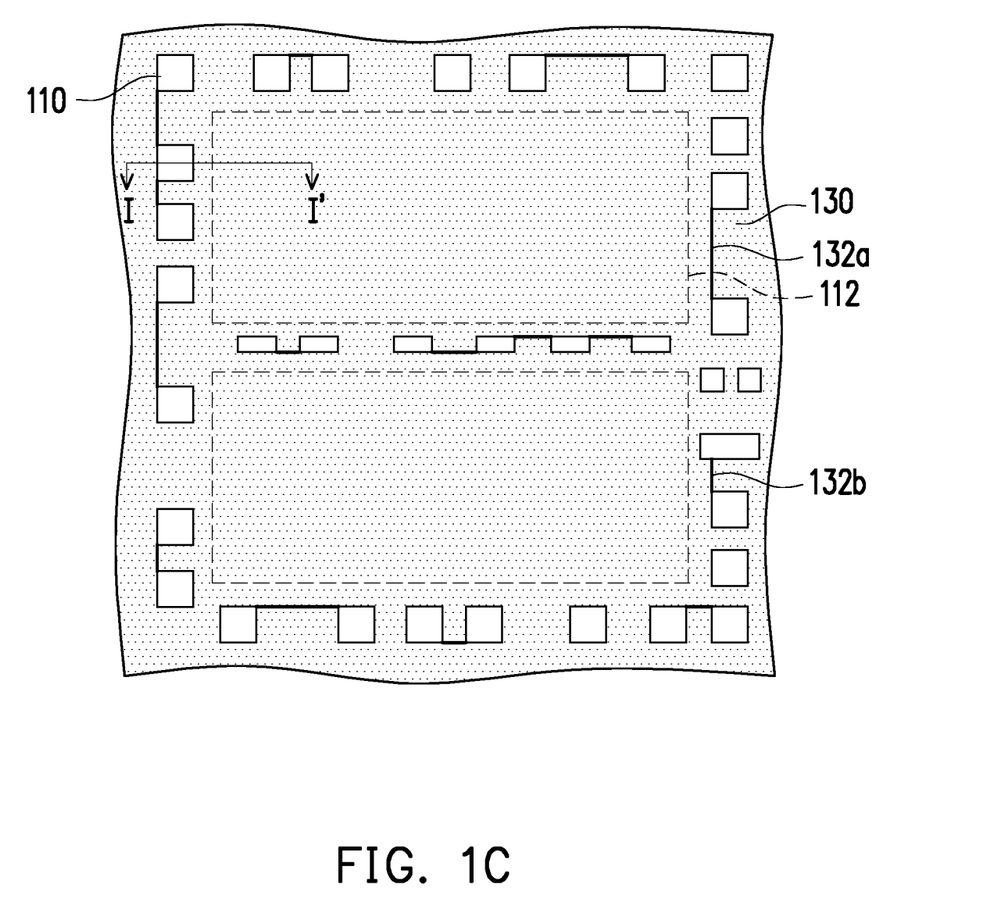
Figure 2C:
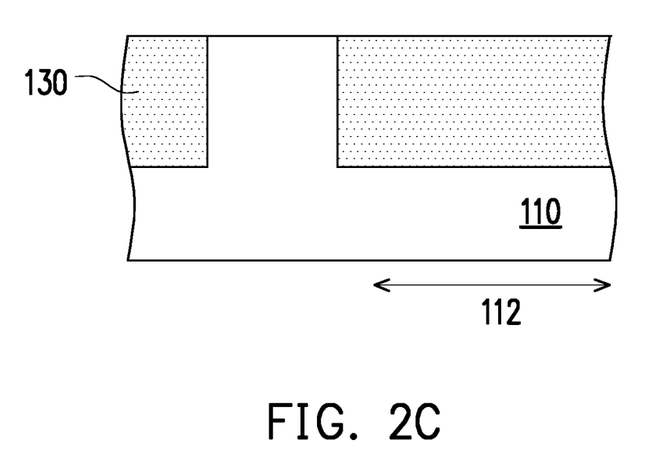

Referring to FIGS. 1C and 2C, the defect-trapping mask 120 is removed to expose the substrate 110 aside the semiconductor material 130. In some embodiments, the defect-trapping mask 120 may be formed by a planarization process such as a chemical mechanical polishing (CMP). In some embodiments, by using a top surface of the substrate 110 as a stop layer, the defect-trapping mask 120 and portions of the semiconductor material 130 are removed, and the top surface of the substrate 110 is exposed. In some embodiments, the top surface of the substrate 110 is substantially flush with a top surface of the semiconductor material 130. After partially removed, a thickness of the semiconductor material 130 ranges from 30 to 70 nm, for example.

Figure 1D:
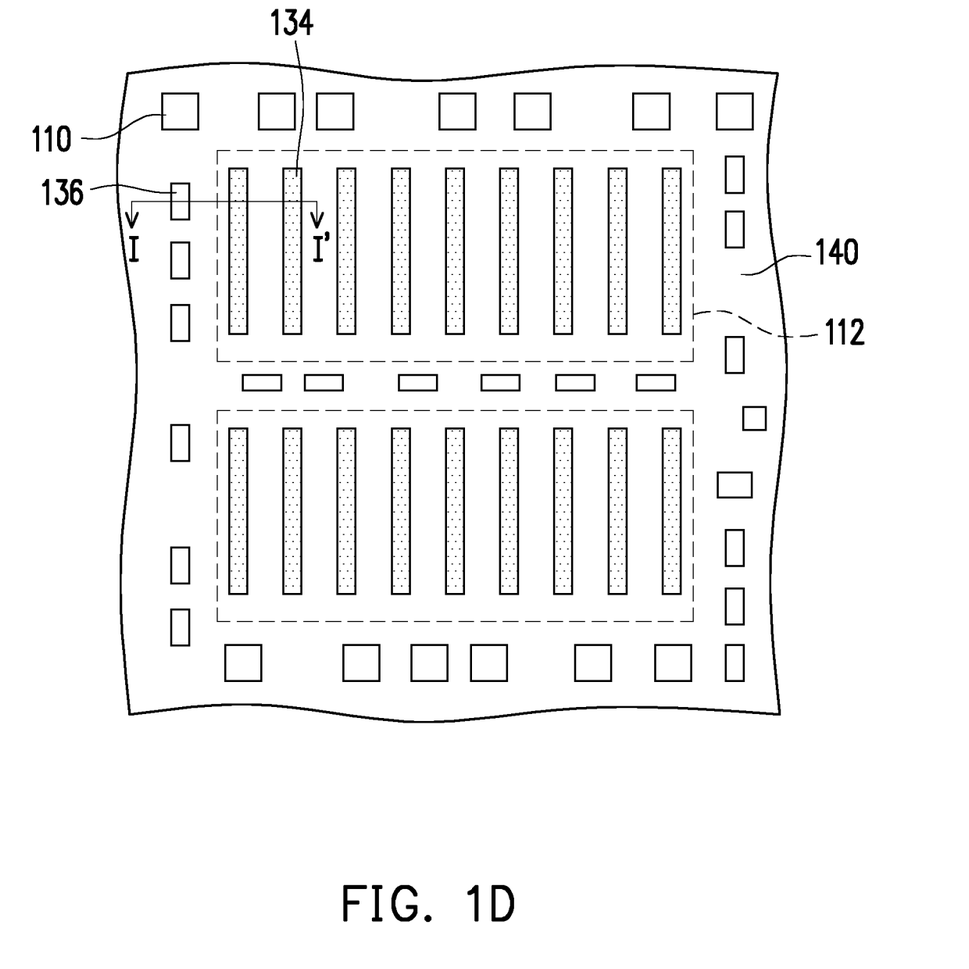
Figure 2D:
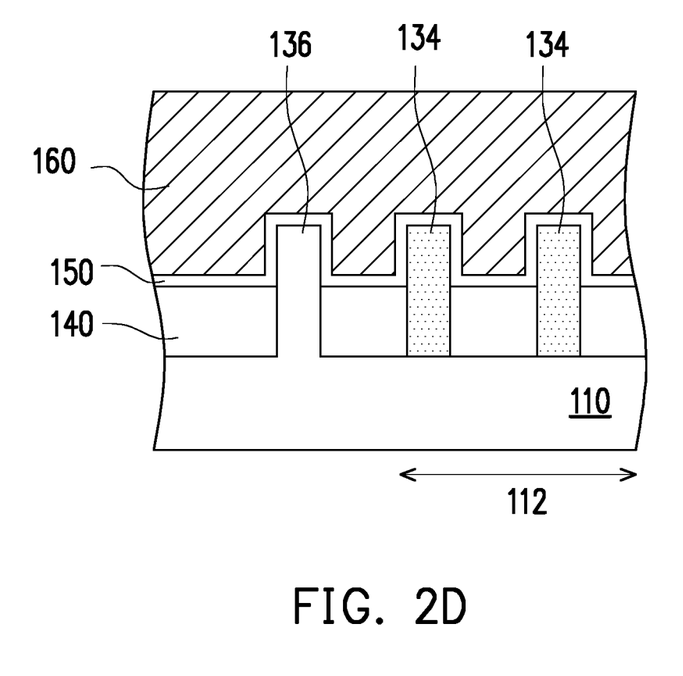

Referring to FIGS. 1D and 2D, the semiconductor material 130 is patterned to form a plurality of channel layers 134 in each of the channel forming regions 112 and a plurality of trenches therebetween. In some embodiments, the channel layers 134 are fins, for example. In some embodiments, the channel layers 134 are second conductivity type channels, for example. In some embodiments, the channel layers 134 are arranged along the horizontal direction and elongated along the direction perpendicular to the horizontal direction, for example. In some embodiments, a portion of the substrate 110 is patterned to form a channel layer 136 aside the channel layer 134. In some embodiments, the substrate 110 may be patterned simultaneously with the semiconductor material 130, that is, the channel layers 134, 136 may be formed simultaneously. In some embodiments, channel length and channel width of the channel layers 134 are respectively constant, for example. However, the disclosure is not limited thereto. In other words, in some alternative embodiments, channel length and/or channel width of the channel layers 134 in the same channel forming region 112 or in different channel forming region 112 may be different. Similarly, channel length and/or channel width of the channel layers 136 may be different. Additionally, as shown in FIG. 1D, at least a portion of the substrate 110 is not patterned to form the channel layer 136. In other words, the substrate 110 aside the channel layers 134 may be formed as a channel or any other suitable element of the semiconductor device.

Then, a plurality of isolation structures 140 are formed in the trenches between the channel layers 134, 136 over the substrate 110. In some embodiments, the isolation structures 140 are shallow trench isolation (STI) structures, for example. The isolation structures 140 are configured to isolate the adjacent channel layers 134, 136. The isolation structures 140 may be formed by filling the trenches between the fins 102 with a dielectric material. In some embodiments, the dielectric material may include silicon oxide, silicon nitride, silicon oxynitride, fluoride-doped silicate glass (FSG), a spin-on dielectric material, a low-k dielectric material, any other suitable dielectric material or a combination thereof. The dielectric material may be formed by high-density-plasma chemical vapor deposition (HDP-CVD), sub-atmospheric CVD (SACVD) or by spin-on.

In some embodiments, after that, a gate dielectric layer 150 is formed over top surfaces of the channel layers 134, 136 and the isolation structures 140. In some embodiments, a material of the gate dielectric layer 150 may be silicon oxide, silicon nitrides, silicon oxynitride or any other suitable dielectric material. In some embodiments, the gate dielectric layer 150 may include a high-k dielectric material having a dielectric constant that is greater than a dielectric constant of $SiO_2$, which is approximately 4. In some embodiments, the high-k gate dielectric material includes $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO or any other suitable high-k dielectric material.

Then, a gate structure 160 is formed over the channel layers 134, 136 respectively. In some embodiments, a plurality of gate structures is formed over the channel layers 134, 136 to cross the channel layers 134, 136. In some embodiments, the gate structures 160 are gate strips, for example. In some embodiments, the gate structure 160 is formed over the gate dielectric layer 150. In some embodiments, a material of the gate structure 160 includes TiAl, TiAlN, TaCN, TiN, WN, W, combinations thereof or any other suitable conductive material.

In some embodiments, the semiconductor device is a field effect transistor such as a fin field effect transistor (FinFET). The FinFET refers to any fin-based, multi-gate transistor. In alternative some embodiments, the field effect transistor may be a planar metal-oxide-semiconductor field effect transistor (MOSFET). Other transistor structures and analogous structures, such as gate-all-around (GAA) field effect transistor or tunneling field effect transistor (TFET), are within the contemplated scope of the disclosure. The field effect transistor may be included in a microprocessor, memory cell, and/or other integrated circuit (IC).

In addition, the semiconductor device of FIGS. 1D and 2D may be further processed using CMOS technology processing. Accordingly, it is understood that additional processes may be provided before, during, and after the method of FIGS. 1A to 1D and 2A to 2D, and that some other processes may only be briefly described herein. Also, FIGS. 1A to 1D and 2A to 2D are simplified for a better understanding of the concepts of the present disclosure. For example, although the figures illustrate the interconnect structure of a field effect transistor, it is understood the field effect transistor may be part of an IC that further includes a number of other devices such as resistors, capacitors, inductors, fuses, etc.

In some embodiments, by forming the defect-trapping mask around the channel forming region, the defects such as misfit defects may be trapped in the semiconductor material formed in the region outside the channel forming region. As a result, defects formed in the semiconductor material grown in the channel forming region may be significantly decreased and even substantially free. Accordingly, the channels formed from the defect-free semiconductor material may have good electrical characteristics, and performance and the yield of the semiconductor device are largely improved. Furthermore, the process window of the selective epitaxial growth process is enlarged.

In accordance with some embodiments of the disclosure, a method of forming a semiconductor device includes following steps. A plurality of hard mask patterns is formed around a region of a substrate, wherein an imaginary connecting line is formed between corners of two of the plurality of hard mask patterns at the same side of the region, and the imaginary connecting line is substantially parallel to or perpendicular to a horizontal direction. A semiconductor layer is formed on the substrate by a selective epitaxial growth process.

In accordance with alternative embodiments of the disclosure, a method of forming a semiconductor device includes following steps. A defect-trapping mask is formed at boundaries of channel forming regions of a substrate. The defect-trapping mask comprises island patterns, an imaginary connecting line is formed between corners of two of the island patterns to cross at least one channel forming region, and the imaginary connecting line is neither parallel to nor perpendicular to a horizontal direction. A semiconductor layer is formed on the substrate by a selective epitaxial growth process. The defect-trapping mask is removed. The semiconductor layer in the channel forming regions is patterned to form channel layers. The gate structures are formed on the channel layers.

In accordance with yet alternative embodiments of the disclosure, a method of forming a semiconductor device includes following steps. Hard mask patterns are formed around a region of a substrate. An imaginary connecting line formed between corners of two of the hard mask patterns at opposite sides of the region is neither parallel to nor perpendicular to a horizontal direction, and an imaginary connecting line formed between corners of two of the hard mask patterns at the same side of the region is substantially parallel to or perpendicular to the horizontal direction. By a selective epitaxial growth process, a semiconductor layer is formed on the substrate exposed by the defect-trapping mask. The defect-trapping mask is removed to expose the substrate. The semiconductor layer and the substrate are patterned to form a first channel layer and a second channel layer respectively. An isolation structure is formed between the first and second channel layers. A gate structure is formed over the first and second channel layers respectively.

In accordance with some embodiments of the disclosure, a semiconductor device includes a substrate and a semiconductor layer. The substrate includes a planar portion and a plurality of pillars on a periphery of the planar portion. The pillars are shaped as rectangular columns, and corners of two of the pillars at the same side of the planar portion are aligned in a horizontal direction or a direction perpendicular to the horizontal direction. The semiconductor layer is disposed over the planar portion and between the pillars.

In accordance with some embodiments of the disclosure, a semiconductor device includes a substrate and a semiconductor layer. The substrate includes a main region and a periphery region surrounding the main region. The substrate includes a first portion in the main region and the periphery region and a plurality of second portions on the first portion in the periphery region, wherein the second portions are shaped as rectangular columns. The semiconductor layer is disposed over the first portion and between the second portions. A first imaginary connecting line is formed between corners of two of the second portions at the same side of the periphery region, and the semiconductor layer has at least one misfit defect along the first imaginary connecting line in the periphery region.

In accordance with some embodiments of the disclosure, a semiconductor device includes a substrate, a plurality of channel layers, an isolation structure and a gate structure. The substrate includes a planar portion and a plurality of pillars on a periphery of the planar portion, wherein the pillars are shaped as rectangular columns. An imaginary connecting line is formed between corners of two of the pillars on opposite sides of the substrate, and the imaginary connecting line is neither parallel to nor perpendicular to a horizontal direction. The channel layers are disposed over the substrate and between the protrusions. The isolation structure is disposed between the protrusions and the channel layers. The gate structure is disposed over the channel layers.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
   a substrate, comprising a planar portion and a plurality of pillar portions on a periphery of the planar portion, wherein the pillar portions are shaped as rectangular columns, and corners of two of the pillar portions at the same side of the planar portion are aligned in a horizontal direction or a direction perpendicular to the horizontal direction; and
   a semiconductor layer over the planar portion and between the pillar portions, wherein misfit defects of the semiconductor layer surrounded by the periphery are less than misfit defects of the semiconductor layer surrounded in the periphery.

2. The semiconductor device of claim 1, wherein a top width and a bottom width of one of the pillar portions are substantially the same.

3. The semiconductor device of claim 1, wherein the pillar portions are disposed at each side of the planar portion.

4. The semiconductor device of claim 1, wherein top surfaces of the pillar portions are substantially flush with a top surface of the semiconductor layer.

5. The semiconductor device of claim 1, wherein corners of two of the pillar portions at different sides of the planar portion are not aligned in the horizontal direction or the direction perpendicular to the horizontal direction.

6. The semiconductor device of claim 1, wherein sidewalls of the two of the pillar portions are aligned in the horizontal direction or the direction perpendicular to the horizontal direction.

7. The semiconductor device of claim 1, wherein the semiconductor layer includes $Si_{(1-x)}Ge_x$, and x is between 0 and 1.

8. A semiconductor device, comprising:
   a substrate including a main region and a periphery region surrounding the main region, the substrate comprising a planar portion and a plurality of pillar portions on the planar portion, wherein the pillar portions are shaped as rectangular columns; and
   a semiconductor layer over the planar portion and between the pillar portions, wherein a first imaginary connecting line is formed between corners of two of the pillar portions at the same side of the periphery region, and the semiconductor layer has at least one misfit defect along the first imaginary connecting line in the periphery region.

9. The semiconductor device of claim 8, wherein sidewalls of the pillar portions are substantially vertical to a surface of the planar portion.

10. The semiconductor device of claim 8, wherein the pillar portions are disposed at each side of the periphery region.

11. The semiconductor device of claim 8, wherein top surfaces of the pillar portions are substantially flush with a top surface of the semiconductor layer.

12. The semiconductor device of claim 8, wherein misfit defects of the semiconductor layer in the main region are less than misfit defects of the semiconductor layer in the periphery region.

13. The semiconductor device of claim 8, wherein separations between the pillar portions are different in width.

14. A semiconductor device, comprising:
- a substrate comprising a planar portion and a plurality of pillar portions on a periphery of the planar portion, wherein the pillar portions are shaped as rectangular columns, and the two closest pillar portions on opposite sides of the planar portion are offset from each other;
- a plurality of channel layers over the substrate and between the pillar portions;
- an isolation structure between the pillar portions and the channel layers; and
- a gate structure over the channel layers.

15. The semiconductor device of claim 14, wherein sizes of the pillar portions in width are different.

16. The semiconductor device of claim 14, wherein the channel layers is a $Si_{(1-x)}Ge_x$ layer, and x is between 0 and 1.

17. The semiconductor device of claim 14, wherein top surfaces of the pillar portions are substantially flush with top surfaces of the channel layers.

18. The semiconductor device of claim 14, wherein corners of two of the pillar portions at the same side of the planar portion are aligned in the horizontal direction or the direction perpendicular to the horizontal direction.

19. The semiconductor device of claim 14, wherein the channel layers are arranged between the two closest pillar portions on the opposite sides of the planar portion.

20. The semiconductor device of claim 14, wherein the pillar portions on the opposite sides of the planar portion are not symmetrically arranged.

* * * * *